(12) United States Patent
Nishihara et al.

(10) Patent No.: US 10,505,516 B2
(45) Date of Patent: Dec. 10, 2019

(54) FILTER AND MULTIPLEXER

(71) Applicant: TAIYO YUDEN CO., LTD., Tokyo (JP)

(72) Inventors: Tokihiro Nishihara, Tokyo (JP); Taisei Irieda, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 92 days.

(21) Appl. No.: 15/610,996

(22) Filed: Jun. 1, 2017

(65) Prior Publication Data

US 2017/0373668 A1 Dec. 28, 2017

(30) Foreign Application Priority Data

Jun. 22, 2016 (JP) ................. 2016-123980

(51) Int. Cl.
*H03H 9/70* (2006.01)
*H03H 9/64* (2006.01)
*H03H 9/72* (2006.01)
*H01L 41/107* (2006.01)
*H03H 9/60* (2006.01)
*H03H 9/56* (2006.01)

(52) U.S. Cl.
CPC .......... *H03H 9/706* (2013.01); *H01L 41/107* (2013.01); *H03H 9/568* (2013.01); *H03H 9/605* (2013.01); *H03H 9/6406* (2013.01); *H03H 9/725* (2013.01)

(58) Field of Classification Search
CPC ...... H03H 9/6406; H03H 9/725; H03H 9/706; H03H 9/605; H03H 9/568; H03H 9/6483; H01L 41/107

USPC ........................................................ 333/133
See application file for complete search history.

(56) References Cited

U.S. PATENT DOCUMENTS

| | | |
|---|---|---|
| 2006/0290446 A1 | 12/2006 | Aigner et al. |
| 2008/0055021 A1 | 3/2008 | Ueda et al. |
| 2008/0252398 A1 | 10/2008 | Jamneala et al. |
| 2011/0227807 A1* | 9/2011 | Iwaki ................... H03H 9/0571 343/850 |

FOREIGN PATENT DOCUMENTS

| | | |
|---|---|---|
| JP | 2007-006495 A | 1/2007 |
| JP | 2008-85989 A | 4/2008 |
| JP | 2009-10932 A | 1/2009 |
| WO | 2010/061477 A1 | 6/2010 |

OTHER PUBLICATIONS

Japanese Office Action dated Jan. 8, 2019, in a counterpart Japanese patent application No. 2016-123980. (A machine translation (not reviewed for accuracy) attached.).

* cited by examiner

*Primary Examiner* — Benny T Lee
*Assistant Examiner* — Hafizur Rahman
(74) *Attorney, Agent, or Firm* — Chen Yoshimura LLP

(57) ABSTRACT

A filter includes: one or more series resonators connected in series between an input terminal and an output terminal, the one or more series resonators including a series resonator located closest to the output terminal, the series resonator located closest to the output terminal having a resonant frequency that is 99.6% or less of or 102.2% or greater of a center frequency of a passband; one or more parallel resonators connected in parallel between the input terminal and the output terminal; and an inductor connected in parallel to the series resonator located closest to the output terminal.

12 Claims, 16 Drawing Sheets

FIG. 8A

| C0 = 0.63 pF (100 Ω) | | |
|---|---|---|
| f2p [MHz] | fr [MHz] | NORMALIZED fr [%] |
| 5000 | 2515.5 | 99.2 |
| 5140 | 2589.8 | 102.2 |

FIG. 8B

| C0 = 1.26 pF (50 Ω) | | |
|---|---|---|
| f2p [MHz] | fr [MHz] | NORMALIZED fr [%] |
| 5000 | 2519.7 | 99.4 |
| 5140 | 2594.1 | 102.3 |

FIG. 8C

| C0 = 3.14 pF (20 Ω) | | |
|---|---|---|
| f2p [MHz] | fr [MHz] | NORMALIZED fr [%] |
| 5000 | 2524.0 | 99.6 |
| 5140 | 2598.3 | 102.5 |

|  | S1 | S2 | S3 | S4 | S5 | P1 | P2 | P3 |
|---|---|---|---|---|---|---|---|---|
| ELECTROSTATIC CAPACITANCE VALUE C0 [pF] | 1.39 | 0.75 | 0.75 | 1.51 | 1.51 | 2.60 | 0.87 | 2.09 |
| RESONANT FREQUENCY fr [MHz] | 2533 | 2549 | 2543 | 2545 | frx | 2460 | 2479 | 2460 |

FILTER AND MULTIPLEXER

CROSS-REFERENCE TO RELATED APPLICATION

This application is based upon and claims the benefit of priority of the prior Japanese Patent Application No. 2016-123980, filed on Jun. 22, 2016, the entire contents of which are incorporated herein by reference.

FIELD

A certain aspect of the present invention relates to a filter and a multiplexer.

BACKGROUND

Rapid diffusion of wireless devices typified by mobile communications increases the demand for small and light acoustic wave resonators and filters formed by combining them. Widely used as the acoustic wave resonators are piezoelectric thin film resonators such as Surface Acoustic Wave (SAW) resonators, Film Bulk Acoustic Resonators (FBARs), and Solidly Mounted Resonators (SMRs). There has been known a technique that divides an acoustic wave resonator to reduce second harmonic generated by the acoustic wave resonator as disclosed in, for example, Japanese Patent Application Publication Nos. 2008-85989 and 2009-10932 (hereinafter, referred to as Patent Documents 1 and 2, respectively).

When a resonator is divided so as to reduce the second harmonic as described in Patent Documents 1 and 2, the number of resonators increases, thereby increasing the chip size. In addition, because of the parasitic capacitance of a wiring line connecting the divided resonators, the degree of reduction of the second harmonic may become insufficient.

SUMMARY OF THE INVENTION

According to a first aspect of the present invention, there is provided a filter including: one or more series resonators connected in series between an input terminal and an output terminal, the one or more series resonators including a series resonator located closest to the output terminal, the series resonator located closest to the output terminal having a resonant frequency that is 99.6% or less of or 102.2% or greater of a center frequency of a passband; one or more parallel resonators connected in parallel between the input terminal and the output terminal; and an inductor connected in parallel to the series resonator located closest to the output terminal.

According to a second aspect of the present invention, there is provided a filter including: series resonators connected in series between an input terminal and an output terminal, the series resonators including a series resonator located closest to the output terminal, the series resonator located closest to the output terminal having a highest or lowest resonant frequency among the series resonators; one or more parallel resonators connected in parallel between the input terminal and the output terminal; and an inductor connected in parallel to the series resonator located closest to the output terminal, the inductor and the series resonator located closest to the output terminal forming an attenuation pole located in a frequency band twice a passband.

According to a third aspect of the present invention, there is provided a multiplexer including any one of the above filters.

BRIEF DESCRIPTION OF THE DRAWINGS

FIG. 8A through FIG. 8C present resonant frequencies fr at which f2p becomes the lower limit and the upper limit of 2×Pass in FIG. 7A through FIG. 7C;

DETAILED DESCRIPTION

Figure 1A:
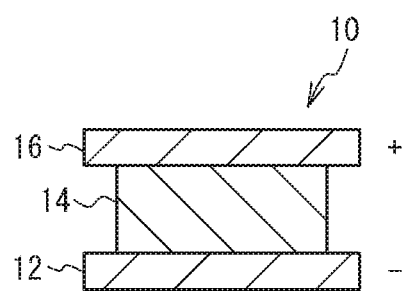
FIG. 1A and FIG. 1B are cross-sectional views of a piezoelectric thin film resonator.
Figure 1B:
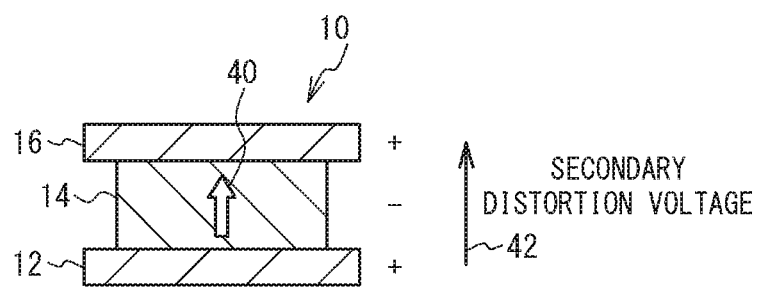

First, a description will be given of secondary distortion by using a piezoelectric thin film resonator as an example. FIG. 1A and FIG. 1B are cross-sectional views of a piezoelectric thin film resonator. As illustrated in FIG. 1A, a piezoelectric film 14 is sandwiched between a lower electrode 12 and an upper electrode 16. In a piezoelectric thin film resonator 10, ½ of the wavelength λ of the resonant frequency approximately corresponds to the thickness of the piezoelectric film 14. That is, the piezoelectric thin film resonator 10 uses ½λ thickness resonance. Accordingly, when the lower electrode 12 polarizes negative (−), for example, the upper electrode 16 polarizes positive (+). One of the upper and lower surfaces of the piezoelectric film 14 polarizes positive (+), and the other polarizes negative (−).

As illustrated in FIG. 1B, the wavelength of the frequency of the second harmonic approximately corresponds to the thickness of the piezoelectric film 14. Thus, an acoustic wave is excited so that both the upper and lower surfaces of the piezoelectric film 14 polarize positive (+) or negative (−) while the center of the piezoelectric film 14 polarizes negative (−) or positive (+). When the piezoelectric film 14 is symmetric in the vertical direction, the second harmonics of the upper electrode 16 and the lower electrode 12 have identical electric potentials. Thus, the second harmonic component is not generated. However, when the piezoelectric film 14 is made of, for example, aluminum nitride (AlN) or zinc oxide (ZnO), the piezoelectric film 14 is oriented in the c-axis orientation to obtain good characteristics. The arrow indicates a c-axis orientation direction 40. At this time, the symmetry in the c-axis orientation is distorted in the piezoelectric film 14, and the electric field has uneven distributions. The uneven distribution causes an electric potential difference between the upper electrode 16 and the lower electrode 12. As described above, a voltage generated by the secondary distortion is referred to as a secondary distortion voltage 42. When the c-axis orientation direction 40 corresponds to the direction from the lower electrode 12 to the upper electrode 16, the secondary distortion voltage 42 is produced in the same direction as the c-axis orientation direction 40. The c-axis orientation direction 40 may be a polarization direction, more generally.

Figure 2A:
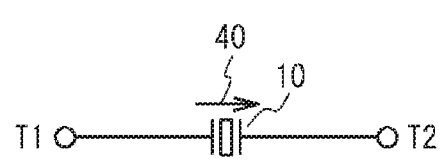
FIG. 2A is a circuit diagram of a piezoelectric thin film resonator.
Figure 2B:
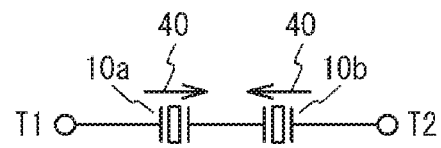
FIG. 2B and FIG. 2C are circuit diagrams in which the piezoelectric thin film resonator of FIG. 2A is divided.
Figure 2C:
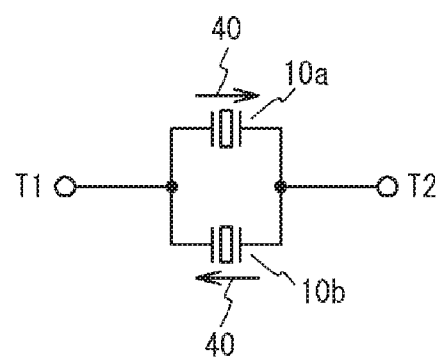

FIG. 2A is a circuit diagram of a piezoelectric thin film resonator, and FIG. 2B and FIG. 2C are circuit diagrams in which the piezoelectric thin film resonator of FIG. 2A is divided. As illustrated in FIG. 2A, the piezoelectric thin film resonator 10 is connected in series between terminals T1 and T2. When a signal with large electrical power is input to the terminal T1 or T2, the second harmonic is emitted to the terminals T1 and T2 as described in FIG. 1B.

A comparative example that reduces the second harmonic will be described. As illustrated in FIG. 2B, the piezoelectric thin film resonator 10 is serially divided into resonators 10a and 10b. The piezoelectric thin film resonator 10 has an electrostatic capacitance value of C, while the resonators 10a and 10b have electrostatic capacitance values of 2C. As illustrated in FIG. 2C, the piezoelectric thin film resonator 10 is divided in parallel into the resonators 10a and 10b. The resonators 10a and 10b have electrostatic capacitance values of C/2.

In FIG. 2B and FIG. 2C, the c-axis orientation directions 40 (polarization directions) are opposite directions as viewed from the terminal T1 (or the terminal T2). Thus, the division in FIG. 2B will be called reverse series division, and the division in FIG. 2C will be called reverse parallel division. Second harmonics with opposite phases are emitted from the resonators 10a and 10b to the terminal T1 (or the terminal T2). When the structures and the dimensions of the resonators 10a and 10b are the same, the second harmonics from the resonators 10a and 10b emitted from the terminal T1 (or the terminal T2) cancel out each other. Thus, the second harmonic emitted from the terminal T1 (or the terminal T2) is reduced.

Figure 3A:
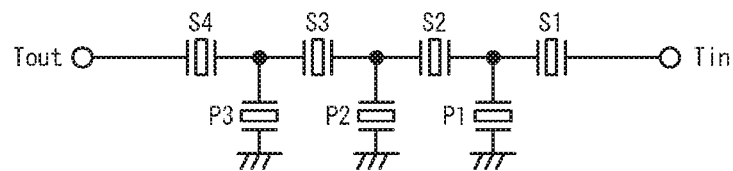
FIG. 3A through FIG. 3D are circuit diagrams of ladder-type filters in accordance with comparative examples.

FIG. 3A through FIG. 3D are circuit diagrams of ladder-type filters in accordance with comparative examples. As illustrated in FIG. 3A, between an input terminal Tin and an output terminal Tout, series resonators S1 through S4 are connected in series and parallel resonators P1 through P3 are connected in parallel. The insertion loss and the degree of suppression of signals outside the passband of a ladder-type filter can be easily changed by changing the number of stages in a ladder, the capacitance ratio of the series resonator and the parallel resonator, or the like. Thus, the design procedure of the ladder-type filter is simple, and therefore, the ladder-type filter is used as a filter for high-frequency signals.

However, when a high-frequency signal with large electrical power is input from the input terminal Tin, the second harmonic is generated in each resonator. Thus, the second harmonic is emitted from the output terminal Tout. The second harmonic emitted from the resonator located closer to the input terminal Tin is attenuated by the resonator located closer to the output terminal Tout. However, the second harmonic emitted from the series resonator S4, which is located closest to the output terminal Tout among the series resonators S1 through S4, is emitted to the output terminal Tout without being attenuated. The second harmonic emitted from the parallel resonator P3, which is located closest to the output terminal Tout among the parallel resonators P1 through P3, is also emitted to the output terminal Tout without being attenuated.

Figure 3B:
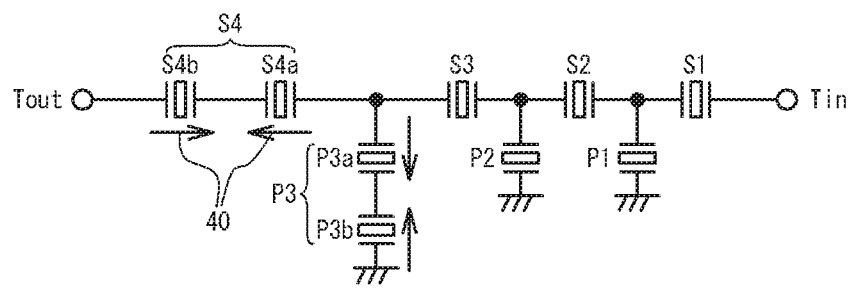
Figure 3C:
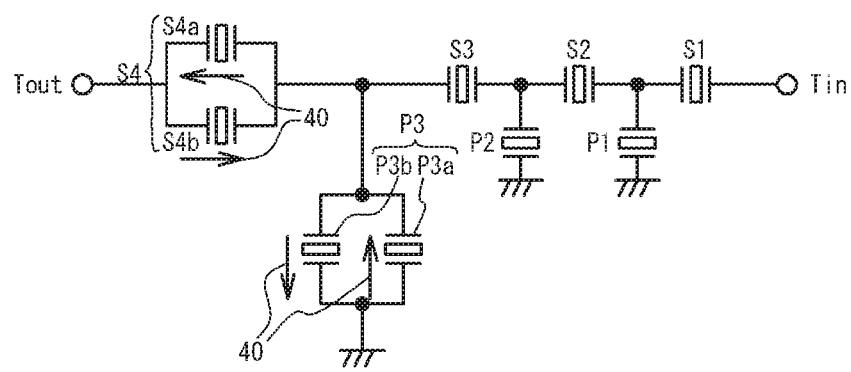
Figure 3D:
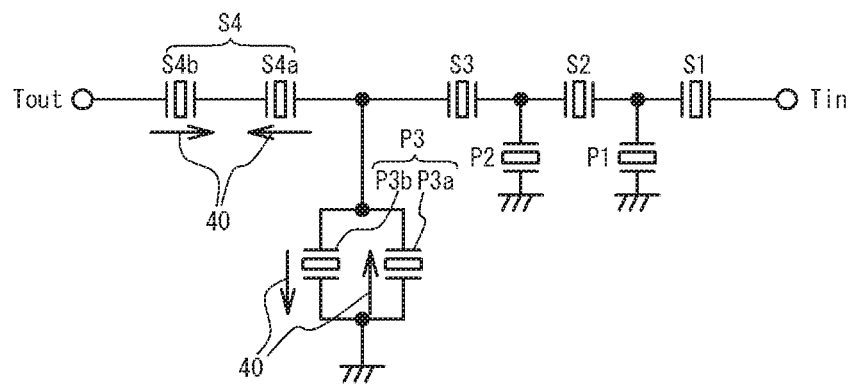

As illustrated in FIG. 3B, the series resonator S4 is divided into resonators S4a and S4b in reverse series. The parallel resonator P3 is divided into resonators P3a and P3b in reverse series. As illustrated in FIG. 3C, the series resonator S4 is divided into the resonators S4a and S4b in reverse parallel. The parallel resonator P3 is divided into the resonators P3a and P3b in reverse parallel. As illustrated in FIG. 3D, the series resonator S4 is divided into the resonators S4a and S4b in reverse series. The parallel resonator P3 is divided into the resonators P3a and P3b in reverse parallel. In FIG. 3B through FIG. 3D, the second harmonics emitted from the series resonator S4 and the parallel resonator P3 to the output terminal Tout are reduced.

However, in the comparative examples of FIG. 3B through FIG. 3D, since the resonators S4a and S4b and the resonators P3a and P3b are provided, the chip size increases. In addition, to reduce the second harmonic, the second harmonics emitted from the divided resonators S4a and S4b (or P3a and P3b) preferably have opposite phases and the same amplitude. However, due to the parasitic capacitance of a wiring line between the resonators S4a and S4b (or P3a and P3b), the second harmonics have phases different from the opposite phases and/or different amplitudes. This prevents the sufficient reduction of the second harmonic.

First Embodiment

Considered was reducing the second harmonic by connecting an inductor in parallel to an acoustic wave resonator. Hereinafter, a description will be given of a simulation.

Figure 4A:
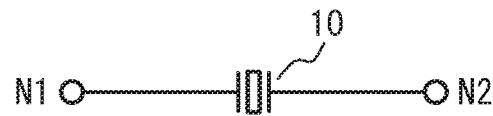
FIG. 4A is a circuit diagram of a piezoelectric thin film resonator.
Figure 4B:
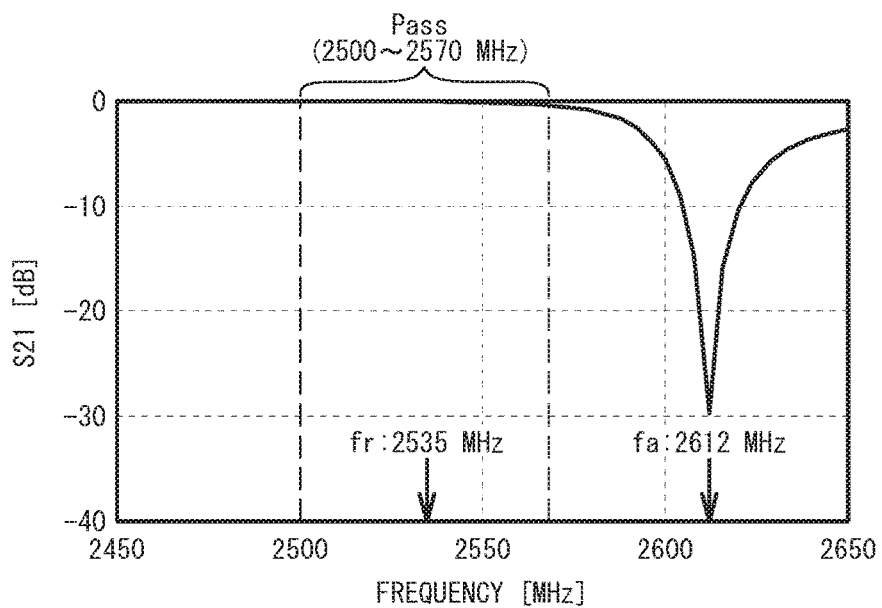
FIG. 4B illustrates a transmission characteristic S21 pf the piezoelectric thin film resonator illustrated in FIG. 4A.
Figure 4C:
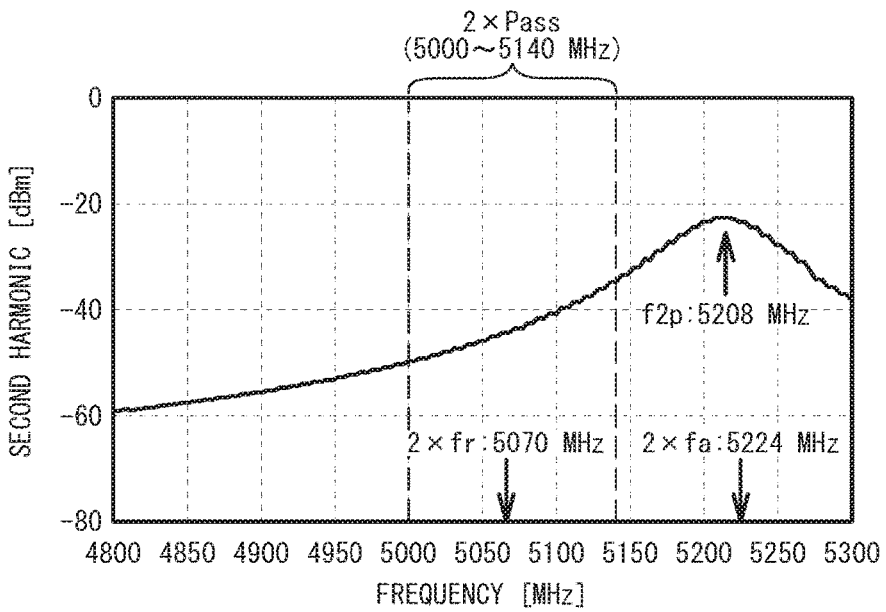
FIG. 4C illustrates second harmonic generated by the piezoelectric thin film resonator illustrated in FIG. 4A.

FIG. 4A is a circuit diagram of a piezoelectric thin film resonator, FIG. 4B illustrates the transmission characteristic S21 of the piezoelectric thin film resonator of FIG. 4A, and FIG. 4C illustrates the second harmonic generated by the piezoelectric thin film resonator of FIG. 4A.

As illustrated in FIG. 4A, the piezoelectric thin film resonator 10 is connected in series between nodes N1 and N2. The piezoelectric thin film resonator 10 is an example of a series resonator of a transmit filter for Band7 (transmit band: 2500 MHz to 2570 MHz). The transmission characteristic and the second harmonic of the piezoelectric thin film resonator 10 were simulated. In the simulation of the second harmonic, calculated was the magnitude of the second harmonic emitted from the piezoelectric thin film resonator 10 when a high-frequency signal is input to the node N2. The second harmonic can be calculated based on a non-linear current that is proportional to "the square of the electric field intensity" applied to the piezoelectric film 14, "the product of the electric field intensity and the strain", and "the square of the strain".

The simulation conditions are as follows.
Piezoelectric film 14: Aluminum nitride (AlN) oriented in the c-axis orientation
Resonant frequency fr: 2535 MHz
Electromechanical coupling coefficient $k^2$: 7.07%
Electrostatic capacitance value C0: 2.1 pF
Power of signals input to the node N2: 28 dBm
Frequency range of signals input to the node N2: 2400 MHz to 2650 MHz
Frequency range of calculated second harmonic: 4800 MHz to 5300 MHz As illustrated in FIG. 4B, the transmit band of Band7 is from 2500 MHz to 2570 MHz. In the transmit filter for Band7, a passband Pass is approximately from 2500 MHz to 2570 MHz. The piezoelectric thin film resonator 10 has a resonant frequency fr of 2535 MHz, and an antiresonant frequency fa of 2612 MHz.

As illustrated in FIG. 4C, a frequency band 2×Pass, which is twice the passband, is from 5000 MHz to 5140 MHz. The frequency 2×fr, which is twice the resonant frequency fr, of the piezoelectric thin film resonator 10 is 5070 MHz, and the frequency 2×fa, which is twice the antiresonant frequency fa, is 5224 MHz. The second harmonic has gentle single-peaked characteristics. A frequency f2p at which the second harmonic peaks (takes the worst value) is 5208 MHz. The frequency f2p is located between 2×fr and 2×fa, but is not located within the frequency band 2×Pass. The transmit filter is desired to suppress the second harmonic in the frequency band 2×Pass (i.e., the frequency band twice the transmit band). The frequency f2p at which the second harmonic generated from the piezoelectric thin film resonator 10 peaks is located outside the frequency band 2×Pass. This is preferable in terms of the second harmonic generated from the piezoelectric thin film resonator 10.

Next, a resonant circuit in which an inductor is connected in parallel to the piezoelectric thin film resonator 10 will be considered. In this structure, an attenuation pole is formed within, for example, the frequency band 2×Pass. Accordingly, the second harmonic emitted from an input-side resonator is inhibited from being output to the output terminal Tout.

Figure 5A:
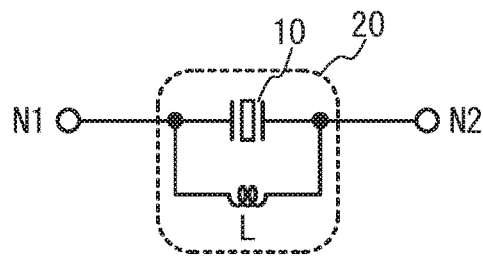
FIG. 5A is a circuit diagram of a resonant circuit.
Figure 5B:
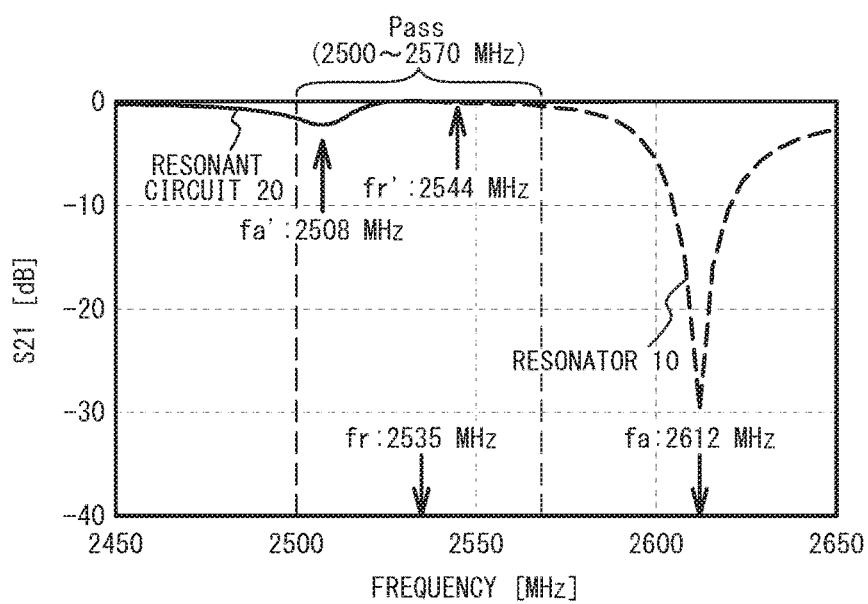
FIG. 5B and FIG. 5C illustrate the transmission characteristic S21 of the resonant circuit illustrated in FIG. 5A.
Figure 5C:
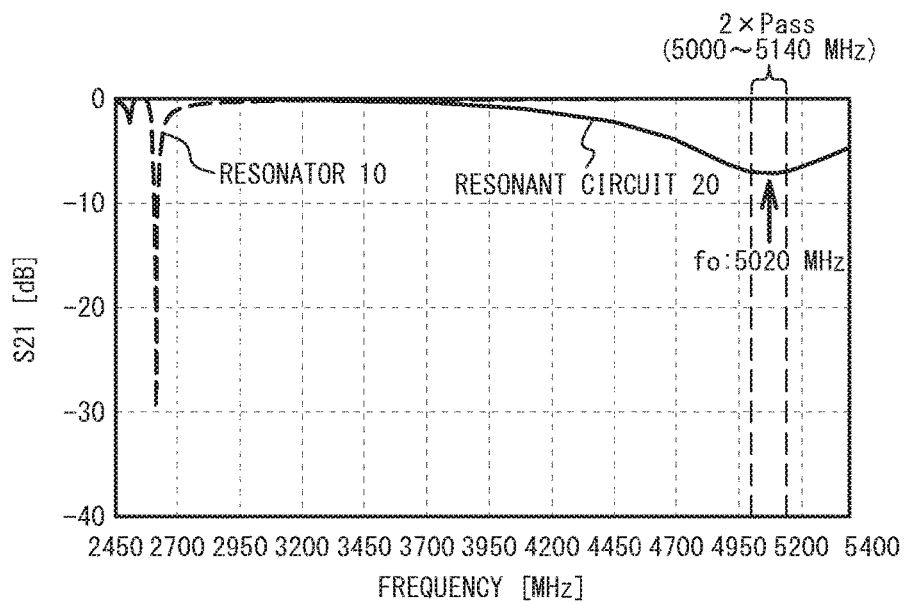
Figure 6:
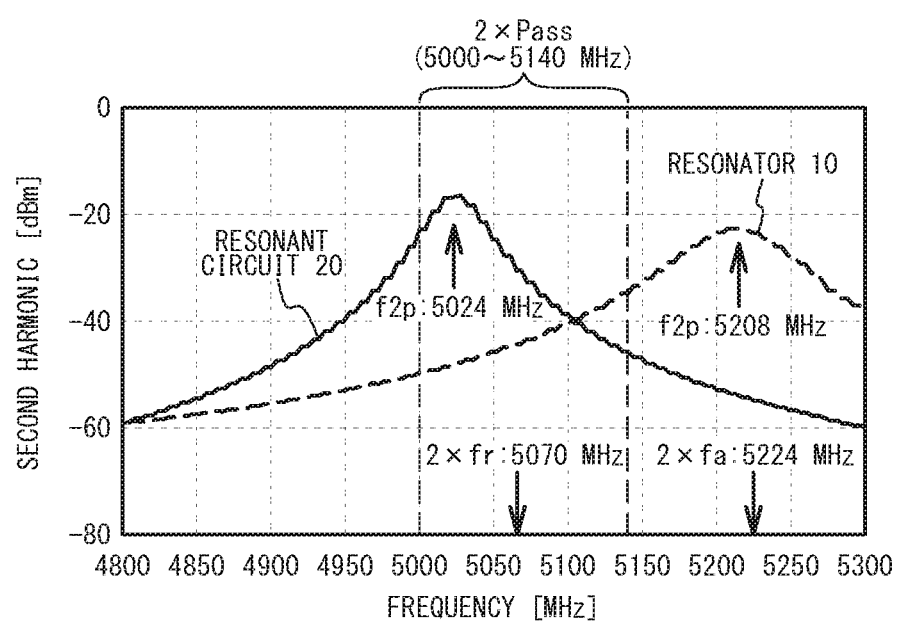
FIG. 6 illustrates second harmonic generated by the resonant circuit illustrated in FIG. 5A.

Simulated was a resonant circuit in which an inductor and a piezoelectric thin film resonator are connected in parallel. FIG. 5A is a circuit diagram of the resonant circuit, and FIG. 5B and FIG. 5C illustrate the transmission characteristic S21 of the resonant circuit illustrated in FIG. 5A. FIG. 6 illustrates the second harmonic generated by the resonant circuit illustrated in FIG. 5A.

As illustrated in FIG. 5A, a resonant circuit 20 includes a piezoelectric thin film resonator 10 and an inductor L. The inductor L is connected in parallel to the piezoelectric thin film resonator 10 between the nodes N1 and N2. The piezoelectric thin film resonator 10 is the same resonator as that of FIG. 4A. The inductance L of the inductor L was set to a value that forms the attenuation pole in 2×Pass. The inductance L can be calculated by the following equation based on a frequency fo at which the attenuation pole is to be formed and an electrostatic capacitance value C0 of the piezoelectric thin film resonator 10.

$$L=(1/fo^2)\times(1/(2\pi)^2\times C0)) \qquad (1)$$

The simulation conditions are as follows.
Inductance L: 0.479 nH
Frequency fo of the attenuation pole: 5020 MHz
The conditions of the piezoelectric thin film resonator 10 are the same as those of FIG. 4A through FIG. 4C.

In FIG. 5B, FIG. 5C, and FIG. 6, dashed lines indicate the piezoelectric thin film resonator 10, and solid lines indicate the resonant circuit 20. When the inductor L is connected in parallel to the piezoelectric thin film resonator 10, two anti-resonant frequencies are formed. As illustrated in FIG. 5B, the antiresonant frequency fa' is 2508 MHz, and the resonant frequency fr' is 2544 MHz. As illustrated in FIG. 5C, the attenuation pole resulting from the anti-resonant frequency is formed in the frequency band 2×Pass, which is twice the passband. The attenuation pole has a frequency fo of 5020 MHz. As seen above, the second harmonic generated by the resonator closer to the input terminal Tin is suppressed by forming the attenuation pole in the frequency band 2×Pass.

As illustrated in FIG. 6, the frequency f2p of the peak of the second harmonic is 5208 MHz in the resonator 10, but is 5024 MHz in the resonant circuit 20. As seen above, when the attenuation pole of the resonant circuit 20 is formed in the frequency band 2×Pass, which is twice the passband, by providing the inductor L, the peak of the second harmonic is located in the frequency band 2×Pass.

Thus, it was decided to set the resonant frequency fr of the piezoelectric thin film resonator 10 (the resonant frequency of the piezoelectric thin film resonator 10 alone without the inductor L) so that the frequency f2p of the peak of the second harmonic is not located in the frequency band 2×Pass.

Figure 7A:
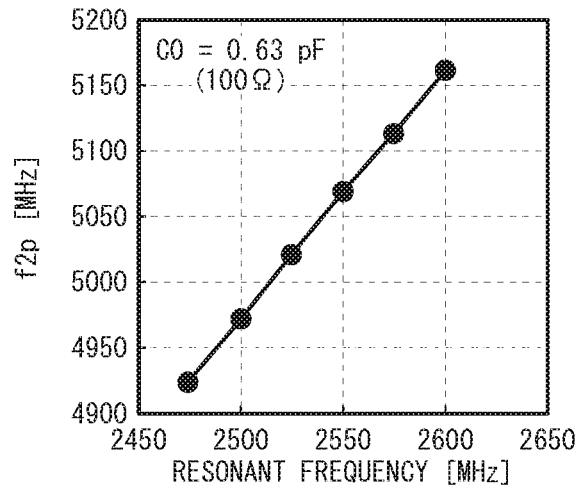
FIG. 7A through FIG. 7C are graphs of frequency f2p of the peak of second harmonic versus resonant frequency fr.
Figure 7B:
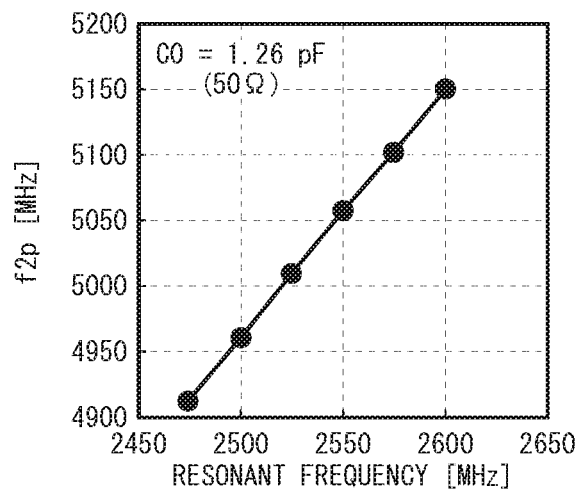
Figure 7C:
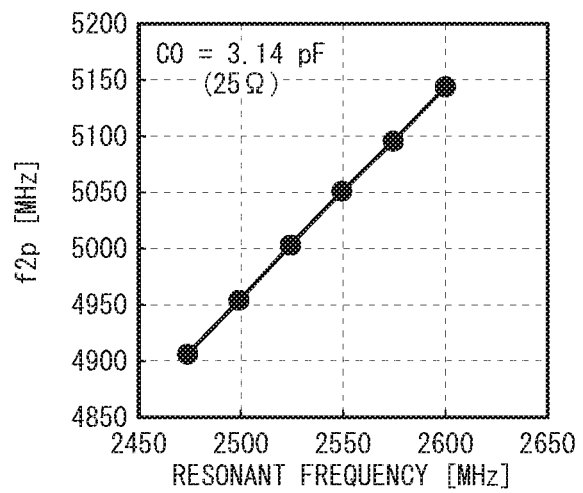

FIG. 7A through FIG. 7C are graphs of the frequency f2p of the peak of the second harmonic versus resonant frequency fr. The electrostatic capacitance value C0 of the piezoelectric thin film resonator 10 is 0.63 pF, 1.26 pF, and 3.14 pF in FIG. 7A through FIG. 7C, respectively. These values respectively correspond to impedance of 100Ω, 50Ω, and 25Ω. In each electrostatic capacitance value C0, the inductance of the inductor L was set so that the frequency fo of the attenuation pole did not change. As presented in the equation 1, the frequency fo of the attenuation pole is determined by the electrostatic capacitance value C0 and the inductance L. Thus, even when the resonant frequency fr of the piezoelectric thin film resonator 10 is changed, fo does not change. Black circles represent simulation values, and solid lines represent approximated lines.

With use of the approximated lines in FIG. 7A through FIG. 7C, calculated was the resonant frequencies fr of the piezoelectric thin film resonator 10 at which the frequency f2p of the peak of the second harmonic becomes the lower limit (5000 MHz) of the frequency band 2×Pass, which is twice the passband, and the upper limit (5140 MHz) of the frequency band 2×Pass. FIG. 8A through FIG. 8C present the resonant frequencies fr at which f2p becomes the lower limit and the upper limit of 2×Pass in FIG. 7A through FIG. 7C, respectively. The normalized fr is a value normalized by dividing the resonant frequency fr by a center frequency fc of the passband Pass (fr/fc×100%).

As presented in FIG. 8A through FIG. 8C, in the case of C0=0.63 pF, f2p is located outside 2×Pass when the normalized fr is made to be 99.2% or less or 102.2% or greater. In the same manner, in the case of C0=1.26 pF, the normalized fr is made to be 99.4% or less or be 102.3% or greater. In the case of C0=3.14 pF, the normalized fr is made to be 99.6% or less or 102.5% or greater. The greatest normalized fr at f2p=5000 MHz and the smallest normalized fr at f2p=5140 MHz are indicated by bold lines. When the normalized fr is made to be 99.6% or less or 102.2% or greater, f2p is not located in the 2×Pass at any C0.

The same calculation was conducted for transmit filters for Band3 (transmit band: 1710 MHz to 1785 MHz) and Band42 (transmission/reception band: 3400 MHz to 3600 MHz). In Band3, f2p is not located in 2×Pass when the normalized fr is made to be 99.5% or less or 103.0% or greater. In Band42, f2p is not located in 2×Pass when the normalized fr is made to be 98.0% or less or 103.6% or greater.

Figures 9A, 9B:
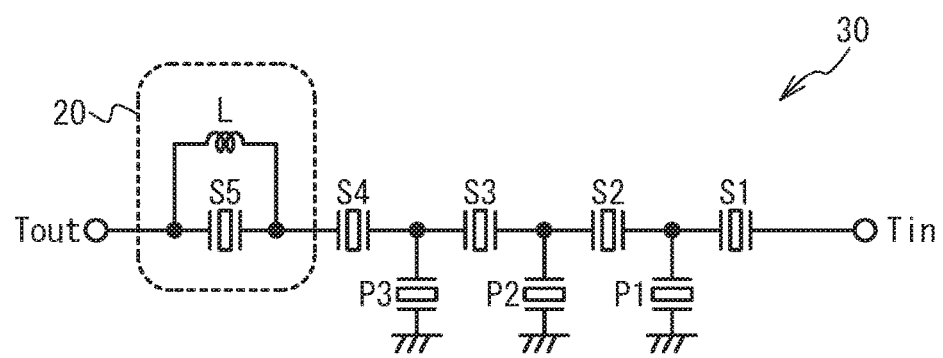
FIG. 9A is a circuit diagram of a filter in accordance with a first embodiment.
FIG. 9B presents the electrostatic capacitance value and the resonant frequency of each resonator.

Next, a ladder-type filter was simulated. FIG. 9A is a circuit diagram of a filter in accordance with the first embodiment, and FIG. 9B presents the electrostatic capacitance value and the resonant frequency of each resonator. As illustrated in FIG. 9A, in a filter 30, series resonators S1 through S5 are connected in series and parallel resonators P1 through P3 are connected in parallel between an input terminal Tin and an output terminal Tout. The inductor L is connected in parallel to the series resonator S5. The series resonator S5 and the inductor L form the resonant circuit 20.

The electrostatic capacitance value C0 and the resonant frequency fr of each resonator were set as presented in FIG. 9B. A resonant frequency frx of the series resonator S5 was varied. The inductance of the inductor L was set based on an electrostatic capacitance value of 1.51 pF of the series resonator S5 so that the attenuation pole was located in 2×Pass (5000 MHz to 5140 MHz). The simulation conditions are as follows.

Figure 10A:
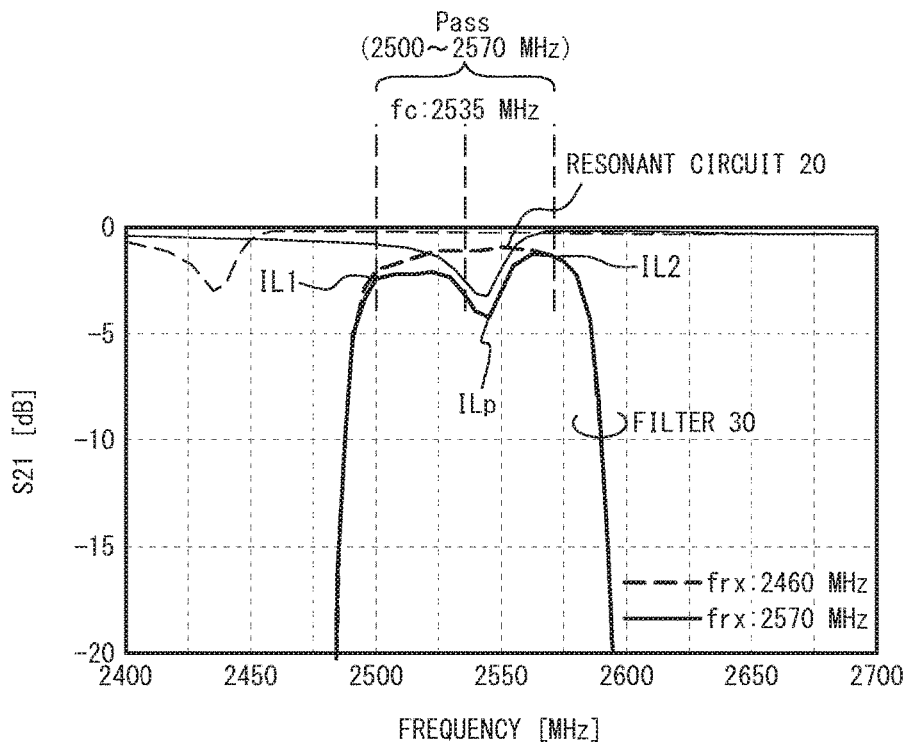
FIG. 10A illustrates the transmission characteristic S21 of the filter of the first embodiment.
Figure 10B:
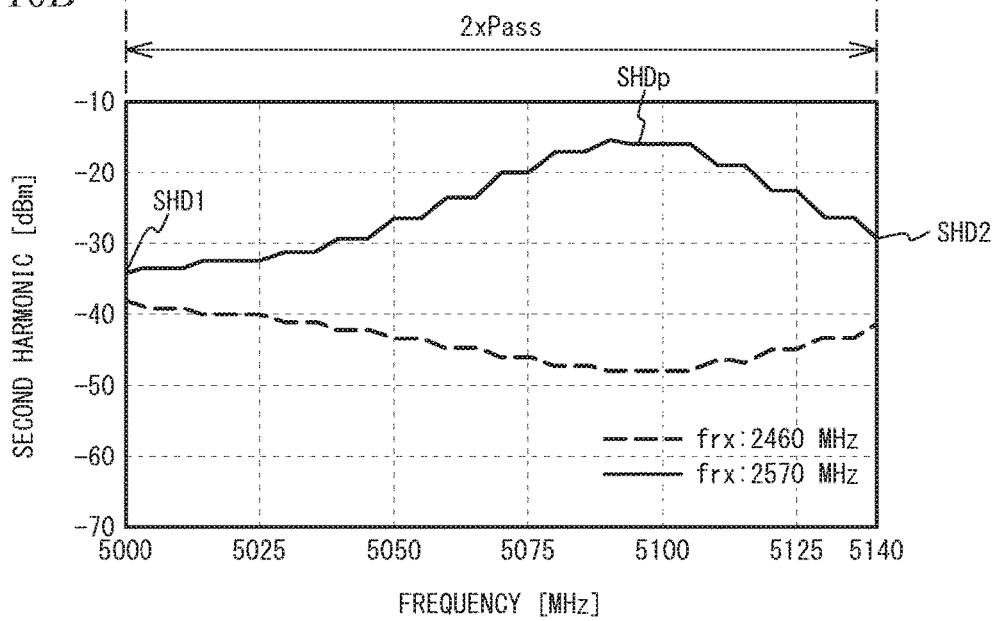
FIG. 10B is a graph of second harmonic versus frequency.

Inductance L: 0.659 nH
Frequency fo of the attenuation pole: 5050 MHz
Power of signals input to the input terminal Tin: 28 dBm
Frequency range of signals input to the input terminal Tin: 2500 MHz to 2570 MHz
Frequency range of calculated second harmonic: 5000 MHz to 5140 MHz FIG. 10A illustrates the transmission characteristic S21 of the filter in accordance with the first embodiment, and FIG. 10B is a graph of second harmonic versus frequency. The dashed line indicates when the resonant frequency frx of the series resonator S5 (the resonant frequency of the series resonator S5 alone without the inductor L) was set to 2460 MHz, and the solid line indicates when the resonant frequency frx of the series resonator S5 was set to 2570 MHz. As illustrated in FIG. 10A, when the resonant frequency frx is 2570 MHz, the anti-resonant frequency of the resonant circuit 20 is located within the passband Pass. Thus, the insertion loss in the passband Pass deteriorates. When the resonant frequency frx is 2460 MHz, the anti-resonant frequency of the resonant circuit 20 is located outside the passband Pass. Thus, the deterioration of the insertion loss in the passband Pass does not occur. As described above, the insertion loss IL in the passband changes depending on the resonant frequency frx. The insertion loss at the lower limit 2500 MHz of the passband Pass is represented by IL1, and the insertion loss at the upper limit 2570 MHz of the passband is represented by IL2. The worst insertion loss in the passband Pass is represented by ILp.

As illustrated in FIG. 10B, a filter with a resonant frequency frx of 2460 MHz has smaller second harmonic than a filter with a resonant frequency frx of 2570 MHz. The second harmonic at the lower limit 5000 MHz of the frequency band 2×Pass, which is twice the passband, is represented by SHD1, and the second harmonic at the upper limit 5140 MHz is represented by SHD2. The worst second harmonic in the frequency band 2×Pass is represented by SHDp.

Figure 11A:
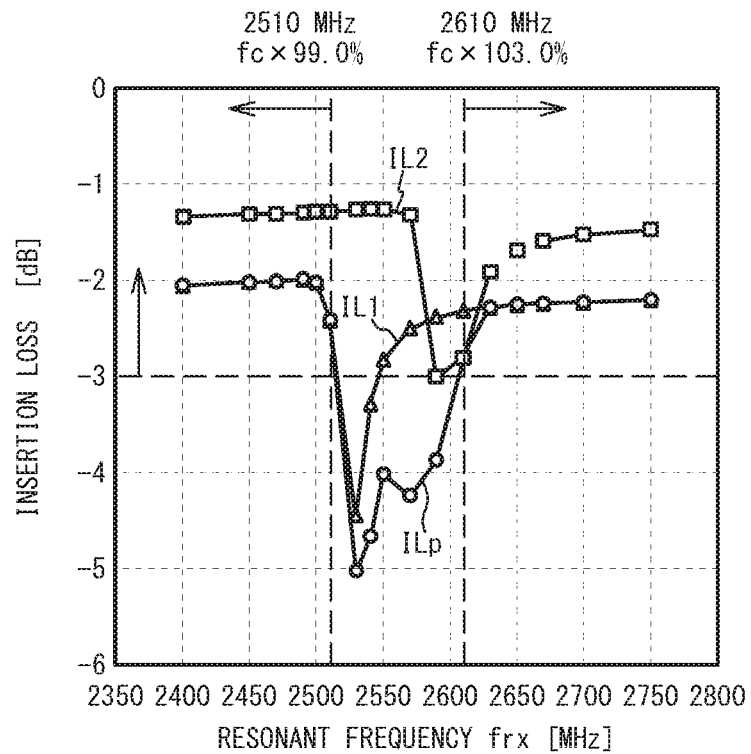
FIG. 11A and FIG. 11B are graphs of insertion loss and second harmonic versus resonant frequency frx, respectively.
Figure 11B:
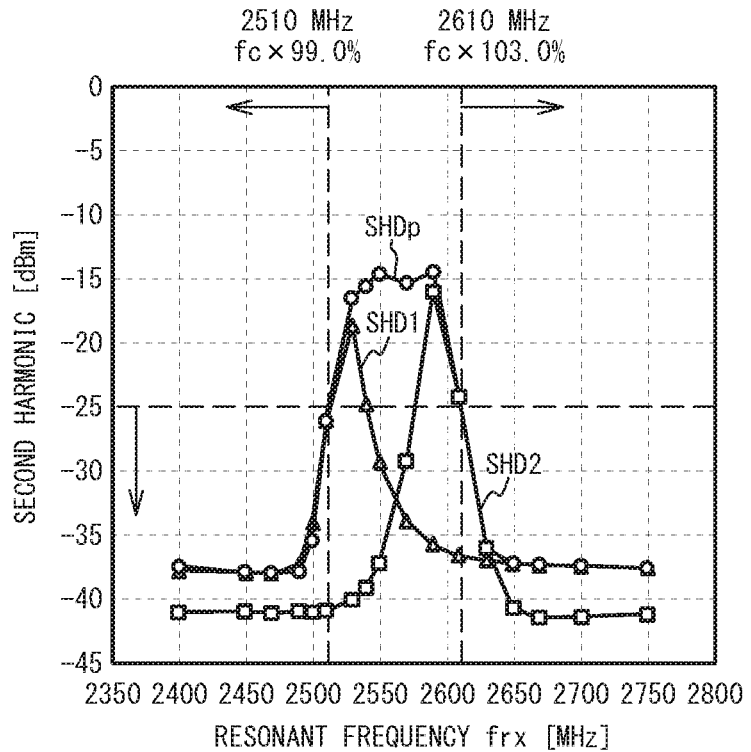

The resonant frequency frx of the series resonator S5 was varied to calculate the insertion losses IL1, IL2, and ILp and the second harmonics SHD1, SHD2, and SHDp. FIG. 11A and FIG. 11B are graphs of insertion loss and second harmonic versus resonant frequency frx, respectively. In FIG. 11A and FIG. 11B, IL1 and SHD1 are indicated by triangles, IL2 and SHD2 are indicated by rectangles, and ILp and SHDp are indicated by open circles.

As illustrated in FIG. 11A, when the resonant frequency frx is near the passband, the insertion losses IL1, IL2, and ILp deteriorate. This is because the anti-resonant frequency of the resonant circuit 20 is located around the passband as illustrated in FIG. 10A. When the resonant frequency frx is made to be 2510 MHz or less or 2610 MHz or greater, all the insertion losses IL1, IL2, and ILp become −3 dB or greater. The frequency is normalized by dividing the frequency by the center frequency fc=2535 MHz of the passband. When the normalized fr is made to be 99.0% or less or 103.0% or greater, all the insertion losses IL1, IL2, and ILp become −3 dB or greater.

As illustrated in FIG. 11B, when the resonant frequency frx is near the passband, the second harmonics SHD1, SHD2, and SHDp deteriorate. This is because the second harmonic generated by the resonant circuit 20 is located near the frequency band 2×Pass as illustrated in FIG. 6. When the resonant frequency frx is made to be 2510 MHz or less or 2610 MHz or greater, all the second harmonics SHD1, SHD2, and SHD become −25 dBm or less.

As illustrated in FIG. 9B, in the ladder-type filter, the resonant frequencies of the series resonators S1 through S4 are made to be approximately the center frequency fc of the passband Pass. Thus, when the resonant frequency frx of the series resonator S5 is made to be within the above-described range, the resonant frequency frx of the series resonator S5 becomes the lowest or the highest among those of the series resonators S1 through S5.

As described above, the inductor L is connected in parallel to the series resonator S5 located closest to the output terminal Tout. The attenuation pole of the resonant circuit 20 is formed within the frequency band 2×Pass. This configuration causes the second harmonics generated from a signal input to the input terminal Tin in the series resonators S1 through S4 and the parallel resonators P1 through P3 to be attenuated in subsequent resonators and to be also attenuated in the attenuation pole of the resonant circuit 20. Thus, the second harmonic emitted from the output terminal Tout is reduced. The resonant frequency frx of the series resonator S5 is made to be away from the passband Pass. This configuration causes the frequency f2p of the peak of the second harmonic generated by the resonant circuit 20 to move away from the frequency band 2×Pass. Thus, the second harmonic emitted to the output terminal Tout is reduced.

As described above, in the first embodiment, in a ladder-type filter including one or more series resonators S1 through S5 and one or more parallel resonators P1 through P3, the inductor L is connected in parallel to the series resonator S5 located closest to the output terminal Tout (i.e., the series resonator located closest to the output terminal Tout in a pathway connecting the input terminal Tin and the output terminal Tout). The resonant frequency frx of the series resonator S5 is made to be 99.6% or less of or 102.2% or greater of the center frequency fc of the passband Pass. This configuration reduces the second harmonic emitted from the output terminal Tout.

The resonant frequency frx of the series resonator S5 is preferably made to be 99.6% or of less or 102.2% or greater of the center frequency fc of the passband Pass, more preferably 99.0% or less of or 103.0% or greater of the center frequency fc of the passband Pass.

In addition, the resonant frequency frx of the series resonator S5 is made to be the highest or the lowest among the resonant frequencies fr of the series resonators S1 through S5. This configuration reduces the second harmonic.

The inductor L is not connected in parallel to at least one series resonator of the series resonators S1 through S4. This configuration can prevent the deterioration of the insertion loss and/or the deterioration of the second harmonic caused by connecting the inductor L. It is preferable that the inductor L is not connected to any of the series resonators S1 through S4. The inductor L may be connected to at least one of the series resonators S1 through S4.

To change the resonant frequency in a piezoelectric thin film resonator, the film thickness of the multilayered film in the resonance region in which the lower electrode 12 and the upper electrode 16 face each other across the piezoelectric film 14 is changed. As the multilayered film, an adjustment film is formed in addition to the lower electrode 12, the piezoelectric film 14, and the upper electrode 16. The resonant frequency can be changed by up to approximately 10 MHz by changing the pattern of the adjustment film in the resonance region. However, to change the resonant frequency by 10 MHz or greater, the film thicknesses of the lower electrode 12, the piezoelectric film 14, and the upper electrode 16 or the film thickness of the adjustment film is to be changed. This complicates the fabrication process. Thus, the resonant frequency frx of the series resonator S5 is made to be the same as the resonant frequency fr of at least one of the parallel resonators P1 through P3. This configuration allows the film thickness of the multilayered film of the series resonator S5 to be the same as the film thickness of the multilayered film of at least one of the parallel resonators P1 through P3. Therefore, the fabrication process is simplified.

Figure 12A:
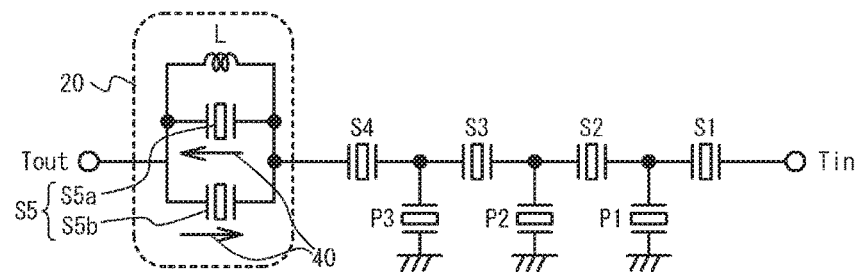
FIG. 12A through FIG. 12C are circuit diagrams of filters in accordance with variations of the first embodiment (No. 1)
Figure 12B:
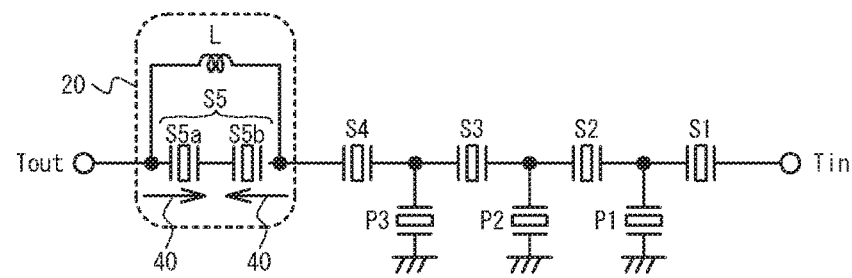

FIG. 12A through FIG. 13B are circuit diagrams of filters in accordance with variations of the first embodiment. As illustrated in FIG. 12A, the series resonator S5 is divided into resonators S5a and S5b in reverse parallel. As illustrated in FIG. 12B, the series resonator S5 is divided into the resonators S5a and S5b in reverse series. Other structures are the same as those of the first embodiment, and the description thereof is thus omitted. The series resonator S5 is divided in reverse parallel or in reverse series. This structure reduces the second harmonic generated by the series resonator S5. Thus, the second harmonic emitted to the output terminal Tout is further reduced. Division of the resonator increases the chip size. Thus, the resonators other than the series resonator S5 are preferably not divided.

Figure 12C:
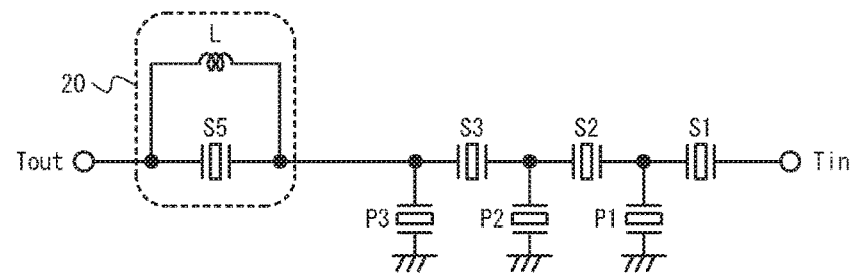

As illustrated in FIG. 12C, the series resonator S4 is not formed. Other structures are the same as those of the first embodiment, and the description thereof is thus omitted. As described above, a series resonator may not be necessarily connected between the series resonator S5 and the parallel resonator P3.

Figure 13A:
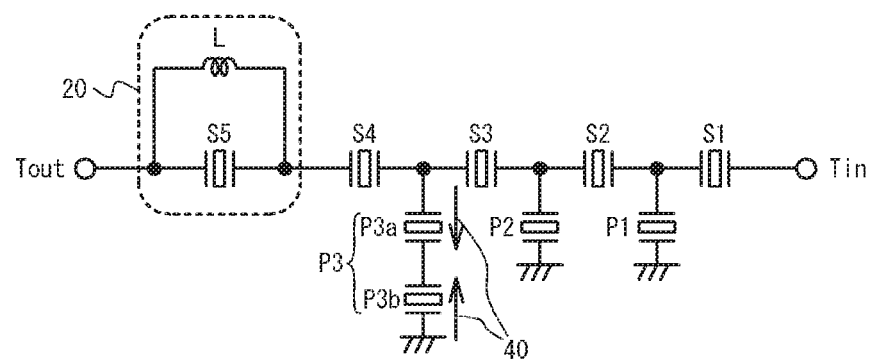
FIG. 13A and FIG. 13B are circuit diagrams of filters in accordance with variations of the first embodiment (No. 2)

As illustrated in FIG. 13A, the parallel resonator P3 is divided in reverse series. Other structures are the same as those of the first embodiment, and the description thereof is thus omitted. As described above, at least one of the series resonators S1 through S4 and the parallel resonators P1 through P3 other than the series resonator S5 may be divided in reverse series or in reverse parallel. This configuration further reduces the second harmonics generated by divided resonators.

The second harmonic generated by a resonator closer to the output terminal Tout is not attenuated by a subsequent resonator, and thus has a larger effect on the second harmonic emitted to the output terminal Tout. Thus, the parallel resonator P3 located closest to the output terminal Tout among the parallel resonators P1 through P3 is divided in reverse series or in reverse parallel. This configuration reduces the second harmonic generated by the parallel resonator P3. Thus, the second harmonic emitted to the output terminal Tout is further reduced. Division of a resonator increases the chip size. Thus, it is preferable not to divide resonators other than the parallel resonator P3.

Figure 13B:
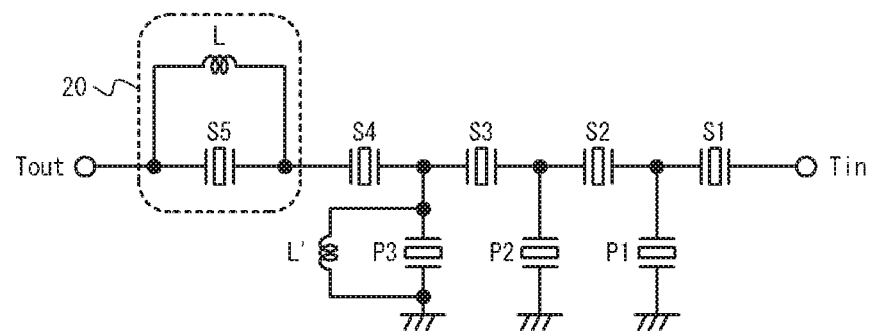

As illustrated in FIG. 13B, an inductor L' is connected in parallel to the parallel resonator P3. Other structures are the same as those of the first embodiment, and the description thereof is thus omitted. This configuration allows the frequency of the peak of the second harmonic of the parallel resonator P3 to be located outside the frequency band 2×Pass. As described above, an inductor is connected in parallel to at least one of the series resonators S1 through S4 and the parallel resonators P1 through P3 other than the series resonator S5. This configuration further reduces the second harmonic. The inductor is preferably connected in parallel to the parallel resonator P3 that has a larger effect on the second harmonic.

The series resonators S1 through S5 and the parallel resonators P1 through P3 may be surface acoustic wave resonators. In the surface acoustic wave resonator, the second harmonic is cancelled in the bus bar of the comb-shaped electrode. Thus, when the series resonators S1 through S5 and the parallel resonators P1 through P3 are piezoelectric thin film resonators such as FBARs or SMRs, the inductor L is preferably connected in parallel to the series resonator S5.

In the first embodiment and the variations thereof, the number of series resonators, the number of parallel resonators, and the frequencies and the electrostatic capacitance values of the resonators are freely selected. In addition, an inductor and/or a capacitor may be coupled to at least one of one or more series resonators and one or more parallel resonators.

Second Embodiment

Figure 14:
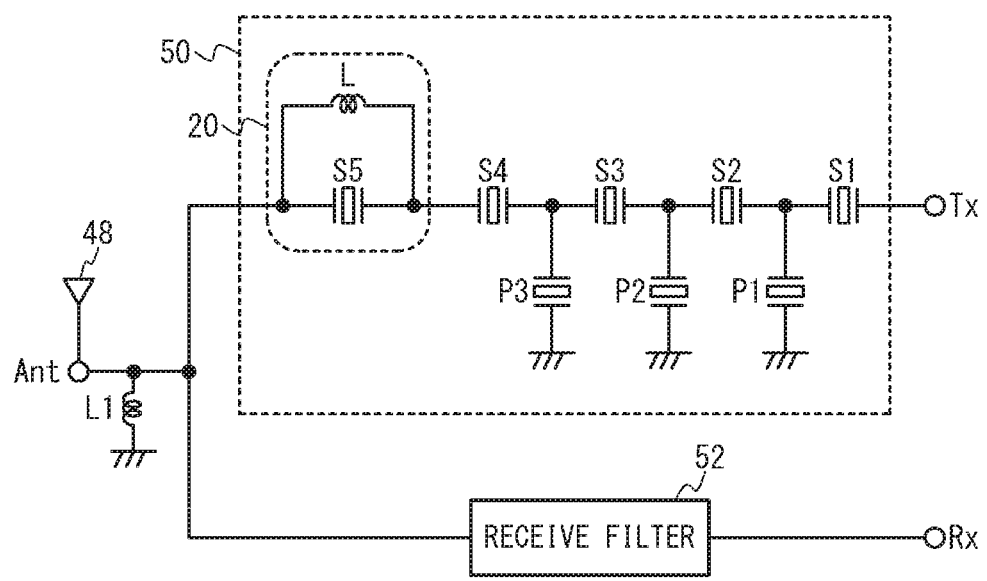
FIG. 14 is a circuit diagram of a duplexer in accordance with a second embodiment.

A second embodiment is an exemplary duplexer using the filter of any one of the first embodiment and the variations thereof. FIG. 14 is a circuit diagram of a duplexer in accordance with the second embodiment. As illustrated in FIG. 14, a transmit filter 50 is connected between a common terminal Ant, to which an antenna 48 is coupled, and a transmit terminal Tx. A receive filter 52 is connected between the common terminal Ant and a receive terminal Rx. The transmit filter 50 is the filter 30 of the first embodiment. An inductor L1 is connected between the common terminal Ant and a ground. The inductor L1 functions as a matching circuit. The transmit filter 50 outputs signals in the transmit band to the common terminal Ant among signals input to the transmit terminal Tx, and suppresses signals with other frequencies. The receive filter 52 outputs signals in the receive band to the receive terminal Rx among signals input to the common terminal Ant, and suppresses signals with other frequencies.

Figure 15:
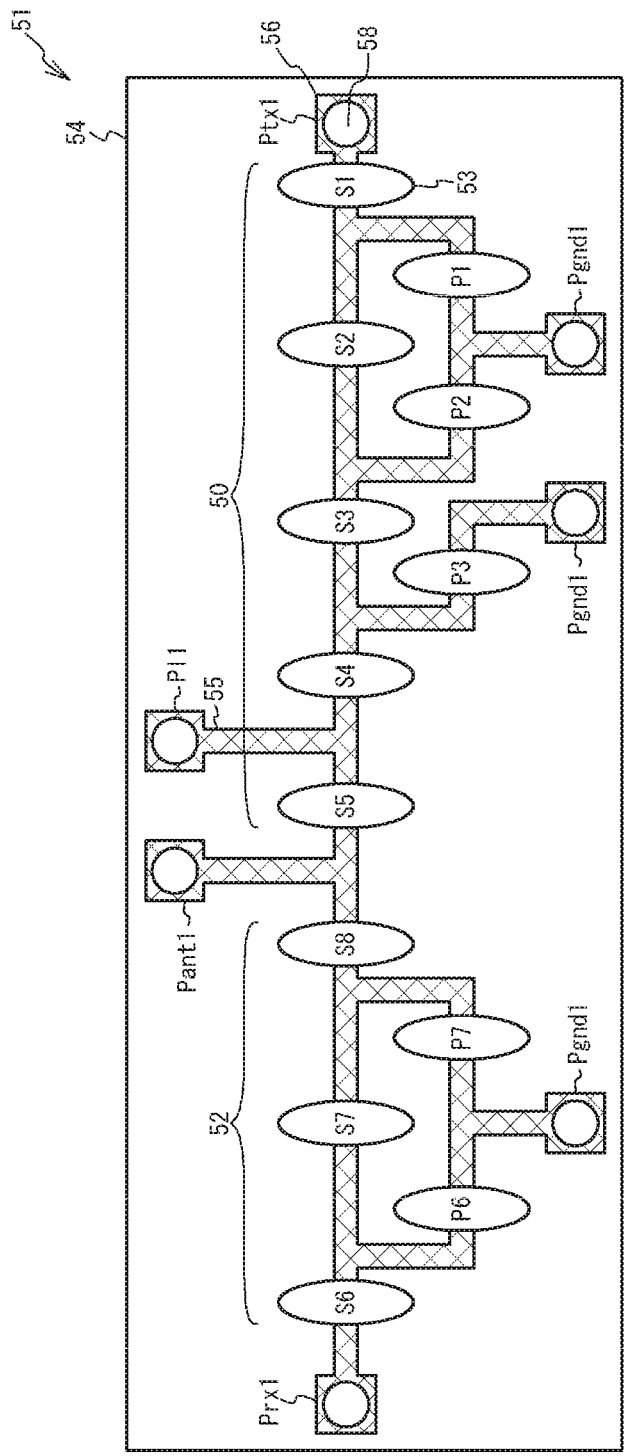
FIG. 15 is a plan view of a chip in the second embodiment.

FIG. 15 is a plan view of a chip in the second embodiment. As illustrated in FIG. 15, a chip 51 includes a substrate 54. Formed on the substrate 54 are wiring lines 55, pads 56, and piezoelectric thin film resonators 53. The piezoelectric thin film resonators 53 and the wiring lines 55 form the transmit filter 50 and the receive filter 52.

The pads 56 include a common pad Pant1, a transmit pad Ptx1, a receive pad Prx1, an inductor pad P11, and ground pads Pgnd1. In the transmit filter 50, between the common pad Pant1 and the transmit pad Ptx1, the series resonators S1 through S5 are connected in series through the wiring lines 55, and the parallel resonators P1 through P3 are connected in parallel through the wiring lines 55. The pad P11 is coupled to a node between the series resonators S4 and S5, and the ground pads Pgnd1 are coupled to the parallel resonators P1 through P3. In the receive filter 52, between the common pad Pant1 and the receive pad Prx1, series resonators S6 through S8 are connected in series through the wiring lines 55, and parallel resonators P6 and P7 are connected in parallel through the wiring lines 55. The ground pads Pgnd1 are coupled to the parallel resonators P6 and P7.

The substrate 54 is, for example, a sapphire substrate, a spinel substrate, a sapphire substrate, or a silicon substrate. The wiring lines 55 and the pads 56 are formed of, for example, a metal layer such as a gold layer, a copper layer, or an aluminum layer. Bumps 58 are, for example, solder bumps, gold bumps, or copper bumps.

Figure 16A:
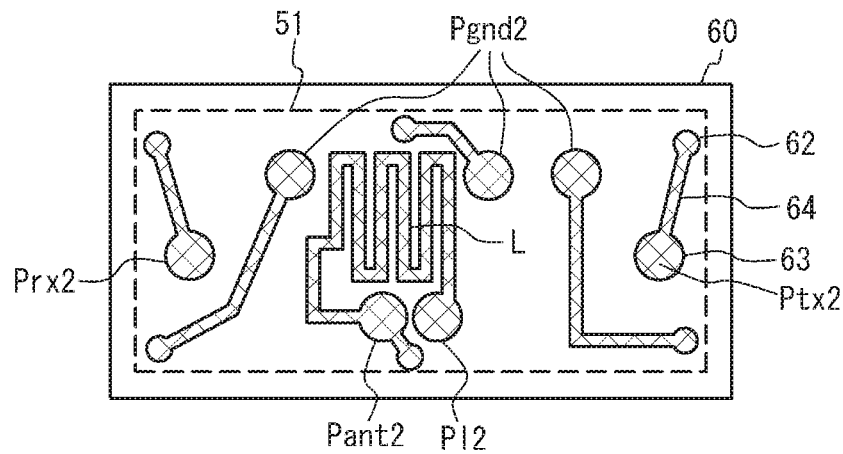
FIG. 16A is a plan view of a package substrate in the second embodiment.
Figure 16B:
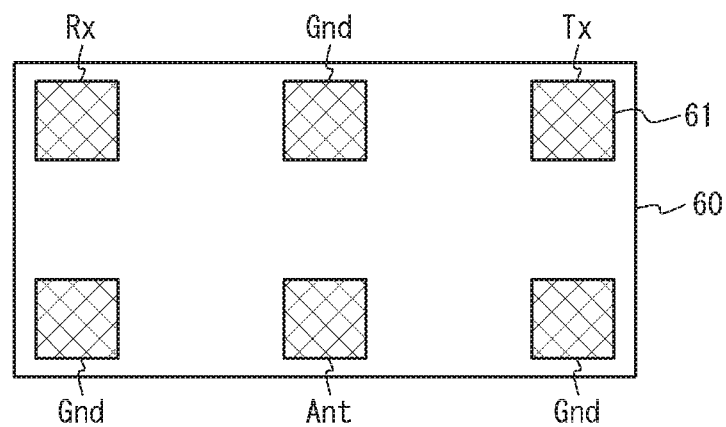
FIG. 16B is a plan view of the package substrate.
Figure 16C:
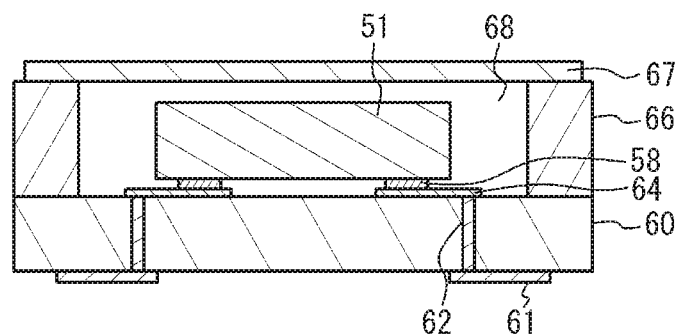
FIG. 16C is a cross-sectional view of a package.

FIG. 16A is a plan view of a package substrate in the second embodiment, FIG. 16B is a plan view of the package substrate, and FIG. 16C is a cross-sectional view of a package. FIG. 15 is a plan view that views the chip from below, and FIG. 16B transparently illustrates the lower surface of the substrate viewed from above. Thus, the top and bottom of FIG. 15 are reversed in FIG. 16A and FIG. 16B.

As illustrated in FIG. 16A and FIG. 16C, the chip 51 is flip-chip mounted on a package substrate 60. Wiring lines 64, pads 63, and the inductor L are formed on the upper surface of the package substrate 60. Via wirings 62 penetrating through the package substrate 60 are formed in the package substrate 60. The wiring line 64 electrically couples the pad 63 to the via wiring 62. The inductor L is formed by the wiring line 64. The pads 63 include a common pad Pant2, a transmit pad Ptx2, a receive pad Prx2, an inductor pad P12, and ground pads Pgnd2. The common pad Pant2, the transmit pad Ptx2, the receive pad Prx2, the inductor pad P12, and the ground pad Pgnd2 are respectively coupled to the common pad Pant1, the transmit pad Ptx1, the receive pad Prx1, the inductor pad P11, and the ground pads Pgnd11 of the chip 51 through the bumps 58.

As illustrated in FIG. 16B and FIG. 16C, terminals 61 are formed on the lower surface of the package substrate 60. The terminals 61 are, for example, foot pads, and include the common terminal Ant, the transmit terminal Tx, the receive terminal Rx, and ground terminals Gnd. The common terminal Ant, the transmit terminal Tx, the receive terminal Rx, and the ground terminal Gnd are electrically coupled to the common pad Pant2, the transmit pad Ptx2, the receive pad Prx2, and the ground pads Pgnd2 through the via wirings 62, respectively. The package substrate 60 is, for example, an insulating substrate made of ceramic or resin. The wiring lines 64, the pads 63, the via wirings 62, and the terminals 61 are formed of a metal layer such as, for example, a copper layer or a gold layer.

As illustrated in FIG. 16C, a frame body 66 is formed on the package substrate 60. A lid 67 is located on the frame body 66. The chip 51 is sealed in an air gap 68.

Since signals with large electrical power are input to the transmit filter 50, the second harmonic is easily generated. Thus, as in the second embodiment, the filter 30 of the first embodiment is used for the transmit filter 50 of a duplexer. This configuration reduces the second harmonic of the duplexer. The filter 30 may be used for the receive filter 52.

The inductor L is located on the package substrate 60 on which the chip 51 including the series resonators S1 through S5 and the parallel resonators P1 through P3 is mounted. This structure decreases the chip size. The inductor L may be an external component such as a chip component.

A duplexer is described as an example of the multiplexer, but the multiplexer may be a triplexer or a quadplexer.

Although the embodiments of the present invention have been described in detail, it is to be understood that the various change, substitutions, and alterations could be made hereto without departing from the spirit and scope of the invention.

What is claimed is:

1. A filter comprising:
   one or more series resonators connected in series between an input terminal and an output terminal, the one or more series resonators including a series resonator located closest to the output terminal, the series resonator located closest to the output terminal having a resonant frequency that is 102.2% or greater of a center frequency of a passband;
   one or more parallel resonators connected in parallel between the input terminal and the output terminal; and
   an inductor connected in parallel to the series resonator located closest to the output terminal,
   wherein the series resonator located closest to the output terminal and the inductor connected in parallel thereto form an attenuation pole within a frequency band equal to twice the passband.

2. The filter according to claim 1, wherein the series resonator located closest to the output terminal and the inductor connected in parallel thereto generate a second harmonic having a peak not located within the frequency band equal to twice the passband.

3. The filter according to claim 1, wherein
   the series resonator located closest to the output terminal has a resonant frequency that is 103% or greater of the center frequency of the passband.

4. The filter according to claim 1, wherein
   the one or more series resonators are a plurality of series resonators, and
   the resonant frequency of the series resonator located closest to the output terminal is a highest among resonant frequencies of the plurality of series resonators.

5. The filter according to claim 1, wherein the one or more series resonators are a plurality of series resonators, and
   an inductor is not connected in parallel to at least one series resonator of the plurality of series resonators other than the series resonator closest to the output terminal.

6. A multiplexer comprising:
   the filter according to claim 1.

7. The filter according to claim 1, wherein at least one of the one or more series resonators and the one or more parallel resonators are divided in reverse series or in reverse parallel.

8. The filter according to claim 1, wherein
   the one or more series resonators and the one or more parallel resonators are piezoelectric thin film resonators.

9. The filter according to claim 1, wherein
   the inductor is located on a substrate on which a chip including the one or more series resonators and the one or more parallel resonators is to be mounted.

10. The filter according to claim 1, wherein
    the series resonator located closest to the output terminal is located closest to the output terminal in a pathway connecting the input terminal and the output terminal.

11. A filter comprising:

series resonators connected in series between an input terminal and an output terminal, the series resonators including a series resonator located closest to the output terminal, the series resonator located closest to the output terminal having a highest resonant frequency among the series resonators;

one or more parallel resonators connected in parallel between the input terminal and the output terminal; and an inductor connected in parallel to the series resonator located closest to the output terminal, the inductor and the series resonator located closest to the output terminal forming an attenuation pole located within a frequency band equal to twice a passband.

12. The filter according to claim 11, wherein the series resonator located closest to the output terminal is located closest to the output terminal in a pathway connecting the input terminal and the output terminal.

\* \* \* \* \*